United States Patent [19]
Tanoi

[11] Patent Number: 5,331,207
[45] Date of Patent: Jul. 19, 1994

[54] LATCH CIRCUIT WITH INDEPENDENT PROPAGATION DELAYS

[75] Inventor: Satoru Tanoi, Tokyo, Japan

[73] Assignee: Oki Electric Industry Co., Ltd., Tokyo, Japan

[21] Appl. No.: 924,470

[22] Filed: Aug. 4, 1992

[30] Foreign Application Priority Data

Aug. 20, 1991 [JP] Japan .................... 3-208042

[51] Int. Cl.⁵ .................. H03K 3/037; H03K 3/356
[52] U.S. Cl. .................. 307/272.1; 307/279; 307/288; 307/289
[58] Field of Search ........... 307/289, 290, 291, 247.1, 307/279, 288, 272.1

[56] References Cited

U.S. PATENT DOCUMENTS

| | | | |
|---|---|---|---|
| 3,339,089 | 8/1967 | Bergman | 307/289 |
| 3,385,980 | 5/1968 | Geller | 307/289 |
| 3,582,674 | 6/1971 | Pound | 307/291 |
| 3,588,545 | 6/1971 | Wright | 307/289 |
| 3,751,683 | 8/1973 | Drost | 307/289 |
| 4,779,011 | 10/1988 | Tsunoi et al. | 307/289 |

FOREIGN PATENT DOCUMENTS 112721 6/1984 Japan .
122220 8/1992 Japan .

*Primary Examiner*—John Zazworsky
*Attorney, Agent, or Firm*—Spencer, Frank & Schneider

[57] ABSTRACT

A latch circuit has two initializing circuits that receive identical inputs and generate two identical output signals, one internal and one external. An inverter inverts the internal output signal to generate a complementary external output signal. One or more control signals can force the output signals to fixed states. When the control signals are inactive, the output signals depend on either an input signal or a feedback signal generated from the internal output signal, as selected by a selecting circuit.

20 Claims, 5 Drawing Sheets

LATCH CIRCUIT WITH INDEPENDENT PROPAGATION DELAYS

BACKGROUND OF THE INVENTION

This invention relates to a latch circuit suitable for semi-custom integration, more particularly to a latch circuit with complementary output signals in which initializing signals such as set and reset signals have priority over latch signals.

Semi-custom integrations are created by interconnecting a set of standardized circuits on a semiconductor chip supplied by a manufacturer to obtain a device with desired functions. Use of semi-custom integrated circuits, typified by so-called gate arrays and application-specific integrated circuits, has become widespread. The standardized circuits employed range from simple logic gates to large macrocells. The standardized latch circuits of the present invention are intermediate in this range.

In designing a semi-custom integrated circuit, the user relies on timing parameters supplied by the manufacturer. In the case of a latch circuit, these timing parameters include, for example, setup time, hold time, input-to-output propagation delay in the unloaded state, and dependency coefficients indicating how the propagation delay increases with the size of the load. It is desirable that these parameters be constant and not vary according to the input and output connections of the circuit in question.

In the case of a circuit with two outputs it is undesirable for the timing parameters of one output to be influenced by the load coupled to the other output. This consideration applies in particular to a standardized latch circuit with two complementary outputs. A latch circuit in which the non-inverting output signal is branched to an inverter that generates the inverting output signal is unsuitable for semi-custom integration, because the propagation delay of the inverting output signal depends strongly on the load of the non-inverting output signal. The same problem occurs in latch circuits that use the inverting or non-inverting output signal as a feedback signal.

One way to avoid such unwanted interactions between the outputs of a latch circuit would be to add more inverters, so that each output signal is driven by an inverter which in turn is driven by an internal signal. Increasing the number of inverters, however, adds to the overall propagation delay, making the resulting latch circuit unfit for high-speed operation.

SUMMARY OF THE INVENTION

It is accordingly an object of the invention to provide a high-speed latch circuit with unvarying timing parameters.

Another object of the invention is to prevent timing interference between the outputs of a latch circuit.

The invented latch circuit receives an input signal, at least one latch signal, and at least one control signal, and generates a pair of complementary output signals. A selecting circuit controlled by the latch signal selects either the input signal or a feedback signal, and generates an internal signal. Two initializing circuits controlled by the same control signal generate two identical output signals that have a fixed state when the control signal is active and are responsive to the internal signal when the control signal is inactive. An inverter inverts one of these output signals. Before being inverted, that output signal is branched through a feedback circuit and input to the selecting circuit as the feedback signal,

DETAILED DESCRIPTION OF THE INVENTION

The invention will now be described in detail with reference to the attached drawings. The drawings are shown as illustrations of the invention; they do not restrict its scope, which should be determined solely from the appended claims.

All signals are binary logic signals having high and low states. The following notational conventions will be used: CT will denote a control signal; I will denote an input signal; LA will denote a latch signal; Q will denote an output signal; R will denote a reset signal; S will denote a set signal; the suffix "a" will denote a non-inverting output signal, or a signal that is active high; suffix "b" will denote an inverting output signal, or a signal that is active low.

Figure 1:
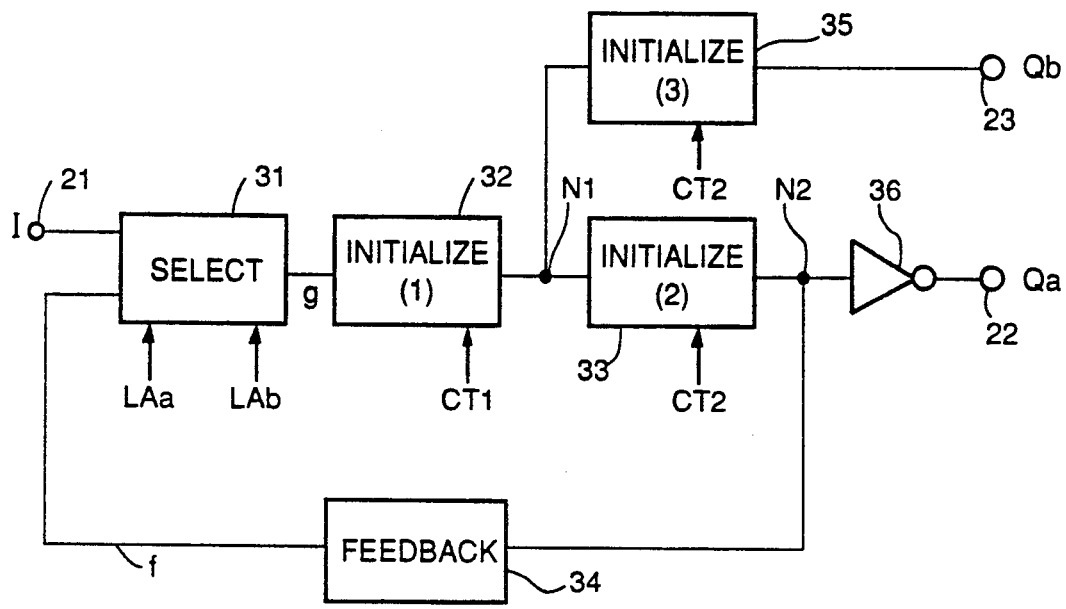
FIG. 1 is a block diagram of the invented latch circuit.

Referring to FIG. 1, the invented latch circuit has an input terminal 21, a first output terminal 22, a second output terminal 23, a selecting circuit 31, a first initializing circuit 32, a second initializing circuit 33, a feedback circuit 34, a third initializing circuit 35, and an inverter 36. The input terminal 21 receives an input signal I. The first and second output terminals 22 and 23 provide non-inverting and inverting output signals Qa and Qb, respectively. In the drawing, the non-inverting output signal Qa is output from the first output terminal 22 and the inverting output signal Qb from the second output terminal 23, but the reverse arrangement is also possible; Qa can be output from the second output terminal 23 and Qb from the first output terminal Qa.

The selecting circuit 31 is coupled to the input terminal 21, from which it receives the input signal I, and to the feedback circuit 34, from which it receives a feedback signal f. The selecting circuit 31 also receives complementary latch signals LAa and LAb. The selecting circuit 31 selects the input signal I when LAa and LAb are active, selects the feedback signal f when LAa and LAb are inactive, and generates a first internal signal g with a logic level determined by the selected signal.

Complementary latch signals are useful in certain types of transistor circuits, an example of which will be shown later, but the invention can of course be practiced with a single latch signal.

The first initializing circuit 32 receives the first internal signal g and a first control signal CT1, and sends a second internal signal to a node N1. When CT1 is active, the second internal signal has a first fixed logic level. When CT1 is inactive, the second internal signal has a logic level determined by the first internal signal g.

The second initializing circuit 33 receives the second internal signal from node N1 and a second control signal CT2, and sends an internal output signal to a node N2. When CT2 is active, the internal output signal has a second fixed logic level. When CT2 is inactive, the internal output signal has a logic level determined by the second internal signal at node N1.

The inverter 36 is coupled to node N2. It inverts the internal output signal at node N2 and sends the inverted result to the first output terminal 22.

The feedback circuit 34 is also coupled to node N2, and sends the feedback signal f to the selecting circuit 31. The logic level of the feedback signal f is determined by the internal output signal at node N2.

The third initializing circuit 35 is coupled to node N1 and also receives the second internal signal and the second control signal CT2. The third initializing circuit 35 has the same function as the second initializing circuit 33, but its output is sent to the second output terminal 23 instead of to node N2.

To avoid redundancy in the following description, it will be assumed that the first output terminal 22 outputs the non-inverting output signal Qa and the second output terminal 23 outputs the inverting output signal Qb. Only the logic level of Qb will be mentioned, it being understood that Qa has the opposite logic level. The reason for this is that the second initializing circuit 33 and third initializing circuit 35 have the same pair of inputs (N1 and CT2), so their outputs are always identical, hence the internal output signal at node N2 and the signal output at the second output terminal 23 are always identical. The inverter 36 ensures that the logic levels of Qa and Qb are always opposite.

Because of the configuration of this latch circuit, the control signals CT1 and CT2 and the complementary latch signals LAa and LAb have a clearly defined priority order. CT2 has highest priority, CT1 has second-highest priority, and the latch signals LAa and LAb have lowest priority. The operation of this latch circuit will be described next for three cases, taken in this priority order.

The first case occurs when CT2 is active. The inverting output signal Qb then has the second fixed logic level, which is output by the third initializing circuit 35 whenever CT2 is active.

The second case occurs when CT2 is inactive but CT1 is active. The logic level of Qb is now determined by the logic level at node N1, which is the first fixed logic level output by the first initializing circuit 32 whenever CT1 is active.

In the third case, both CT1 and CT2 are inactive. The operation now depends on the complementary latch signals LAa and LAb. The logic level of Qb is determined by the logic level at node N1, which in turn is determined by the first internal signal g. When LAa and LAb are active, g is determined by the input signal I; hence Qb is determined by I. When LAa and LAb are inactive, g is determined by the feedback signal f, which is determined by the internal output signal at node N2. The feedback loop from node N2 through the feedback circuit 34, the selecting circuit 31, the first initializing circuit 32, and the second initializing circuit 33 back to node N2 is adapted so that the existing logic level at node N2 is returned to node N2. Node N2 and the signals Qa and Qb therefore remain in their existing states.

The advantages of the invented latch circuit are as follows.

First, because of the clearly prioritized manner in which the circuit responds to the latch signals LAa and LAb and the control signals CT1 and CT2, there are no ambiguous output states. When active, CT1 always takes priority over CT2 and the latch signals LAa and LAb. Similarly, CT2 always has priority over the latch signals.

Second, the inverter 36 that drives the non-inverting output signal Qa is independent of the third initializing circuit 35 that drives the inverting output signal Qb, i.e. neither circuit drives the other, and neither Qa nor Qb is fed back. The timing parameters of Qa are therefore unaffected by the load coupled to Qb, and the timing parameters of Qb are unaffected by the load coupled to Qa.

Third, only a single inverter 36 is required to obtain the complementary outputs Qa and Qb. No extra inverters are needed between the third initializing circuit 35 and the second output terminal 23, or between the inverter 36 and the first output terminal 22. The second advantage cited above is therefore gained without any sacrifice of operating speed.

The latch circuit in FIG. 1 can be implemented in many ways, several of which will be described next.

Figure 2:
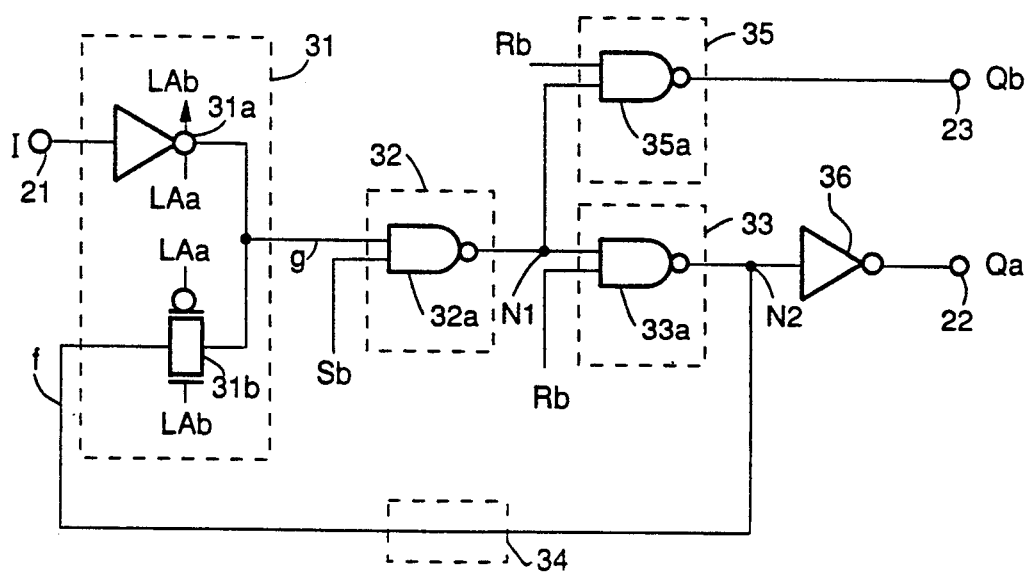
FIG. 2 is a schematic diagram of an implementation of the latch circuit in FIG. 1.

A first implementation is illustrated in FIG. 2. Elements that were shown in FIG. 1 are now indicated by dotted lines with the same reference numerals. In this circuit the active state of the control signals is the low state. The first and second fixed logic levels are both the high level.

The selecting circuit 31 comprises a dynamic inverter 31a that receives the input signal I, and a transmission gate 31b that receives the feedback signal f. The dynamic inverter 31a and transmission gate 31b also receive and are controlled by the complementary latch signals LAa and LAb. The outputs of the dynamic inverter 31a and transmission gate 31b are both coupled to the output line of the selecting circuit 31.

When LAa and LAb are active, the dynamic inverter 31a inverts the logic level of the input signal I, and the transmission gate 31b is switched off. (To say that a circuit is switched off means herein that its output is in the high-impedance state.) The first internal signal g therefore has a logic level opposite to that of the input signal I.

When LAa and LAb are inactive, the dynamic inverter 31a is switched off and the transmission gate 31b is switched on. The first internal signal g is now the same as the feedback signal f.

The first initializing circuit 32 comprises a two-input NAND gate 32a. One input is the first control signal, which is a set signal now denoted Sb instead of CT1. The other input is the first internal signal g from the selecting circuit 31. When Sb is active (low), the output of the NAND gate 32 is always high; when Sb is inactive (high), the NAND gate 32b acts as an inverter on the first internal signal g.

The second initializing circuit 33 and the third initializing circuit 35 comprise NAND gates 33a and 35a. The second control signal is a reset signal, now denoted Rb instead of CT2. The inputs to the NAND gates 33a and 35a are Rb and the second internal signal at node N1. The operation of these circuits is analogous to the operation of the NAND gate 32a.

The feedback circuit 34 comprises simply a wired interconnection between node N2 and the selecting circuit 31.

Figure 3:
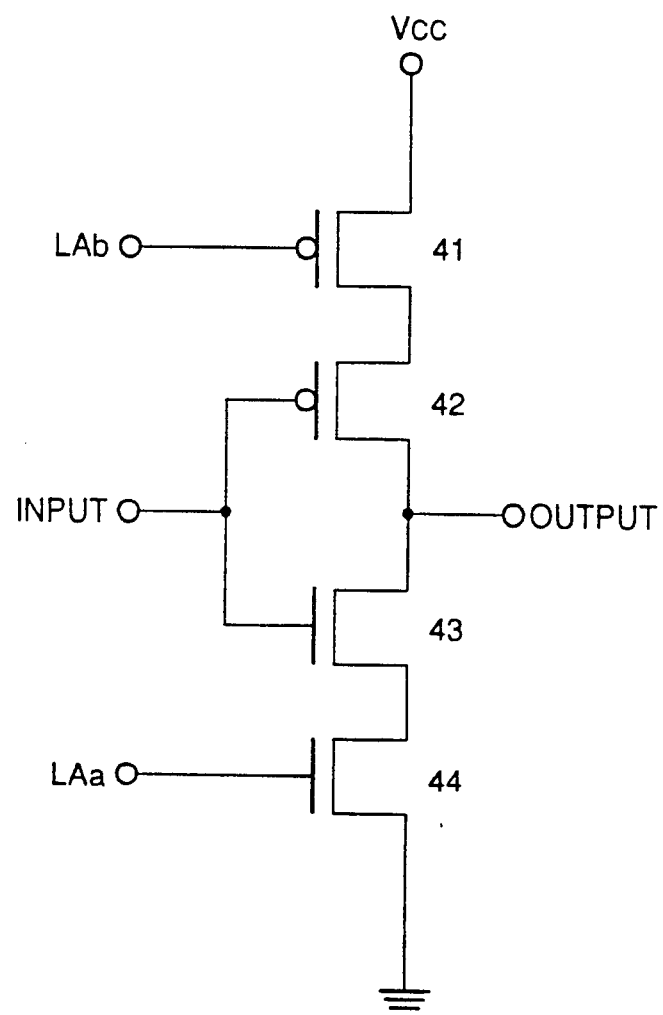
FIG. 3 is a schematic diagram of the dynamic inverter in FIG. 2.

The circuits in FIG. 2 can be fabricated using well-known complementary metal-oxide-semiconductor (CMOS) logic. FIG. 3 is a schematic diagram of a CMOS implementation of the dynamic inverter 31a, comprising two p-channel (PMOS) transistors 41 and 42 and two n-channel (NMOS) transistors 43 and 44 coupled in series between a power supply terminal (Vcc) and ground. The input signal I drives the gates of the PMOS transistor 42 and the NMOS transistor 43. The latch signal LAa drives the gate of the NMOS transistor 44. The latch signal LAb drives the gate of the PMOS transistor 41. When LAa and LAb are active (LAa high and LAb low), the PMOS transistor 41 and NMOS transistor 44 are both on and the output logic level is opposite to the input logic level. When LAa and LAb are inactive (LAa low and LAb high), the PMOS transistor 41 and NMOS transistor 44 are both off and the output is in the high-impedance state.

The invention is of course not limited to CMOS circuits. It can be practiced with bipolar circuits, bipolar-CMOS circuits, and other types of circuits.

Referring again to FIG. 2, this latch circuit operates as already described. When the reset signal Rb is active (low), the outputs of the NAND gates 33a and 35a are both high (the second fixed logic level), so Qa is low and Qb is high.

When Rb is inactive (high) but the set signal Sb is active (low), the output of the NAND gate 32a is high (the first fixed logic level). This output is inverted by the NAND gates 33a and 35a and the inverter 36, so Qa is high and Qb is low.

When the latch signals LAa and LAb are active and the set and reset signals Sb and Rb are inactive, the logic level of the input signal I is inverted three times, by the dynamic inverter 31a, the NAND gate 32a, and the NAND gate 35a, to produce the inverting output signal Qb, and is inverted four times, by the dynamic inverter 31a, the NAND gate 32a, the NAND gate 33a, and the inverter 36, to produce the non-inverting output signal Qa. Having been inverted an even number of times, Qa has the same logic level as I. Having been inverted an odd number of times, Qb has the opposite logic level.

When LAa, LAb, Sb, and Rb are all inactive, the feedback signal f is inverted an even number of times (twice, by the NAND gates 32a and 35a) on the path from node N2 through the feedback circuit 34 and the transmission gate 31b back to node N2. Node N2 and outputs Qa and Qb therefore remain in their existing states.

Figure 4:
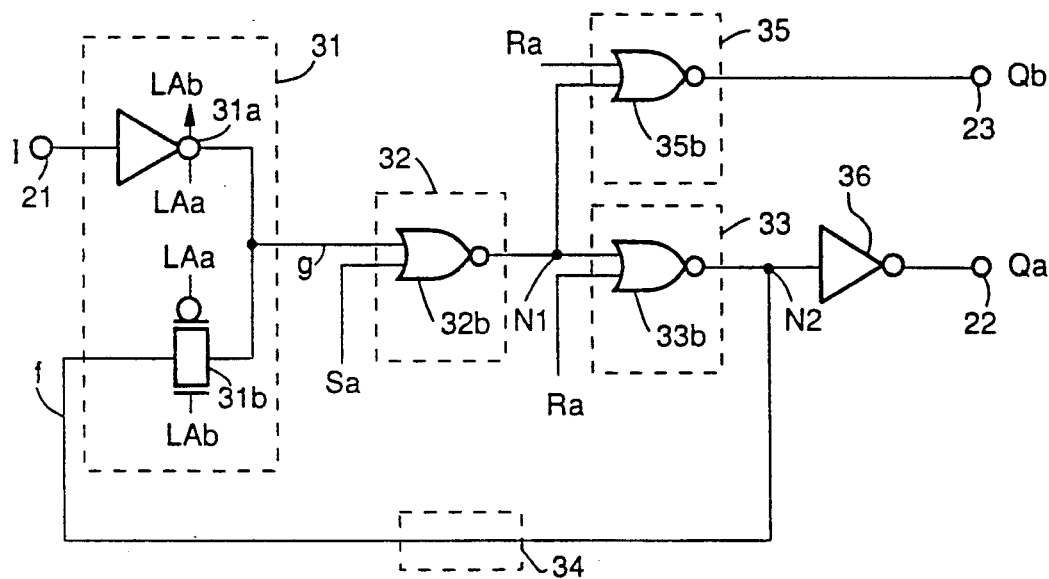
FIG. 4 is a schematic diagram of another implementation of the latch circuit in FIG. 1.

FIG. 4 shows another implementation of the circuit in FIG. 1 in which the first initializing circuit 32, the second initializing circuit 33, and the third initializing circuit 35 comprise NOR gates 32b, 33b, and 35b, respectively. The set and reset signals, denoted Sa and Ra, are now both active high. The selecting circuit 31 and the feedback circuit 34 are the same as in FIG. 2.

The operation of this circuit is analogous to the operation of the circuit in FIG. 2, so a detailed description will be omitted. When Ra is active (high), Qa is fixed high and Qb is fixed low. When Ra is inactive (low) but Sa is active (high), Qa is fixed low and Qb is fixed high. When Ra and Sa are both inactive (low), Qa and Qb depend on the latch signals LAa and LAb and input signal I in exactly the same way as in FIG. 2.

Figure 5:
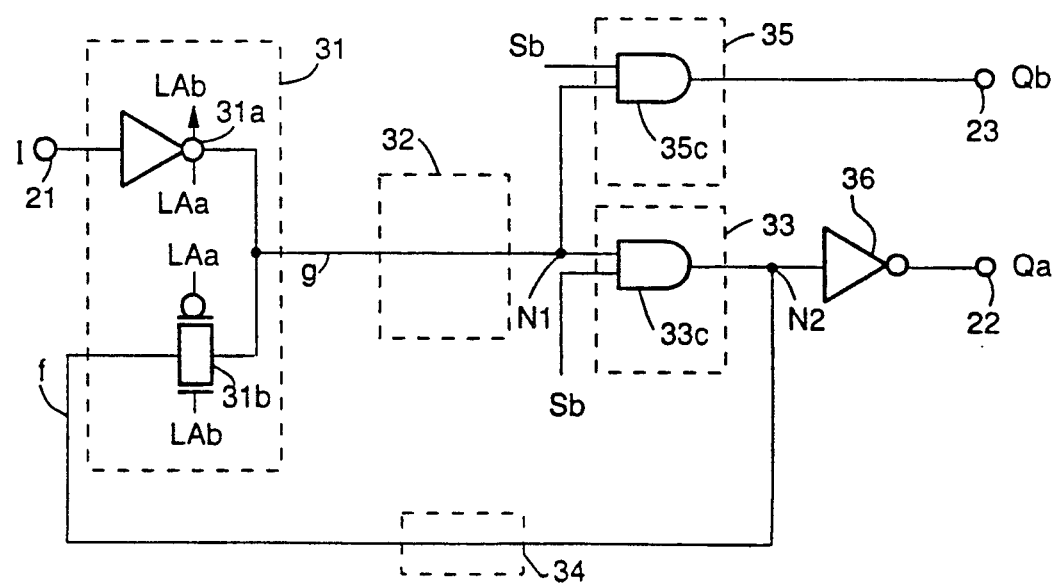
FIG. 5 is a schematic diagram of a modified implementation of the latch circuit in FIG. 1.

FIG. 5 shows a variation in which there is only one control signal, a set signal Sb that is active low. When there is only one control signal it is treated as the second control signal in FIG. 1. The second fixed logic level is in this case the low level. There is no first fixed logic level.

The selecting circuit 31 in FIG. 5 is the same as in FIGS. 2 and 4. Because there is no first control signal, the first initializing circuit 32 in FIG. 5 is just a wired interconnection. The second initializing circuit 33 and third initializing circuit 35 comprise AND gates 33c and 35c. The feedback circuit 34 is again a wired interconnection.

When the set signal Sb is active (low), the outputs of the AND gates 33c and 35c are low, so Qa is fixed high and Qb is fixed low.

When the set signal Sb is inactive (high), the operation depends on the latch signals LAa and LAb as before. When LAa and LAb are active, the input signal I is inverted an odd number of times (once, by the inverter 31a) on the path to the second output terminal 23, and an even number of times (twice, by the inverters 31a and 36) on the path to the first output terminal 22, so Qa has the same logic level as I and Qb has the opposite logic level. When LAa and LAb are inactive, the feedback signal f is inverted an even number of times (zero times) on the path from node N2 through the feedback circuit 34, the transmission gate 31b, the AND gate 33c, and back to node N2, so the Qa and Qb outputs remain in their existing states.

The circuit in FIG. 5 has the advantages recited above: no ambiguous output states; no unwanted timing interactions between the two outputs Qa and Qb; and no extra inverters.

Figure 6:
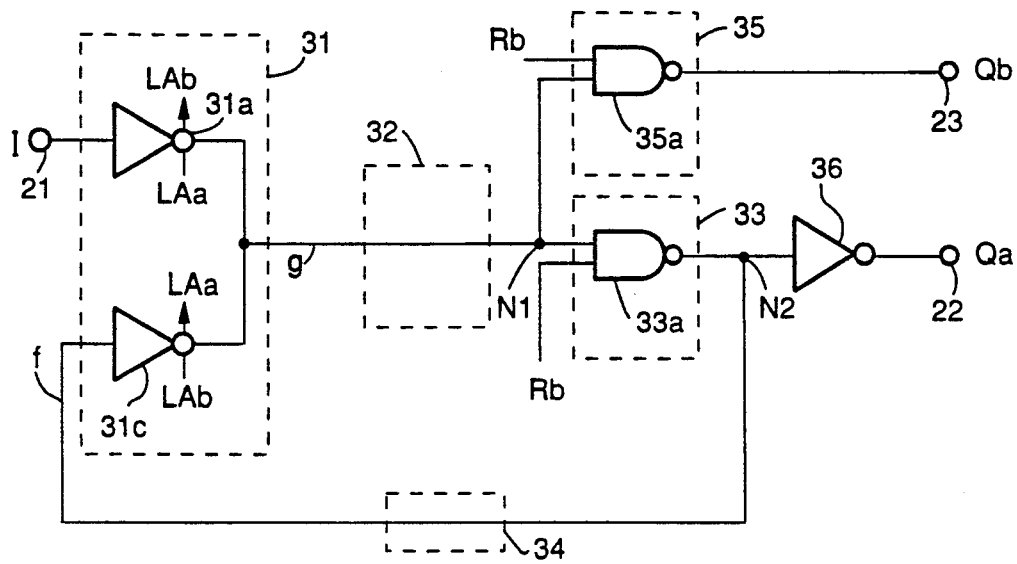
FIG. 6 is a schematic diagram of another modified implementation of the latch circuit in FIG. 1.

FIG. 6 shows another implementation having only one control signal, this time a reset signal Rb that is active low. Here the non-inverting output signal Qa is obtained from the second output terminal 23 and the inverting output signal Qb from the first output terminal 22.

The selecting circuit 31 now comprises a pair of dynamic inverters 31a and 31c controlled by the latch signals LAa and LAb. When LAa and LAb are active, the dynamic inverter 31a inverts the input signal I and the dynamic inverter 31c is turned off. When LAa and LAb are inactive, the dynamic inverter 31a is turned off and the dynamic inverter 31c inverts the feedback signal f. The first initializing circuit 32 and the feedback circuit 34 are wired interconnections, and the second and third initializing circuits 33 and 35 comprise NAND gates 33a and 35a as in FIG. 2.

When the reset signal Rb is active (low), Qa is fixed high and Qb is fixed low. When Rb is inactive (high) the operation depends on the latch signals LAa and LAb.

When LAa is and LAb are active, the selecting circuit 31 selects the input signal I. This signal is inverted twice (by the dynamic inverter 31a and NAND gate 35a) to produce the non-inverting output signal Qa, and three times (by the dynamic inverter 31a, NAND gate 33a, and inverter 36) to produce the inverting output signal Qb.

When LAa and LAb are inactive, the selecting circuit 31 selects the feedback signal f. This signal is inverted twice (by the dynamic inverter 31c and the NAND gate 33a) on the path from node N2 through the feedback circuit 34 and selecting circuit 31 back to node N2, so node N2 and the outputs Qa and Qb remain in their existing states.

Figure 7:
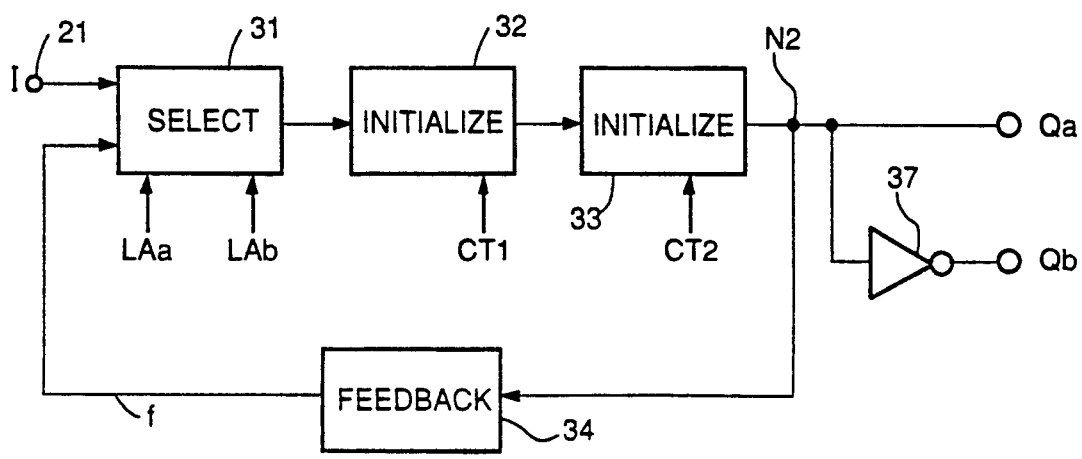
FIG. 7 is as block diagram of a prior-art latch circuit.

The effect of the invention can best be seen by a comparison. FIG. 7 shows a prior-art latch circuit comprising a selecting circuit 31, a first initializing circuit 32, a second initializing circuit 33, a feedback circuit 34, and an inverter 37. The output of the second initializing circuit 33 provides the non-inverting output signal Qa, and this output is inverted by the inverter 37 to provide the inverting output signal Qb. As noted earlier, this circuit is unsuitable for semi-custom integration because the load coupled to the non-inverting output signal Qa strongly affects the propagation delay of the inverter 37, thus interfering with the timing parameters of the inverting output signal Qb.

Figure 8:
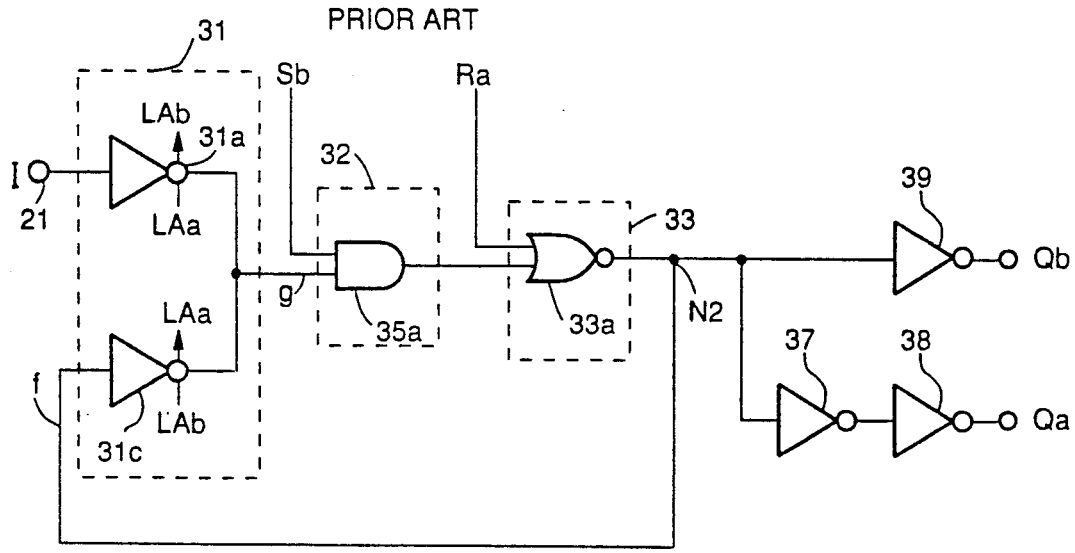
FIG. 8 is a schematic diagram of an implementation of the latch circuit in FIG. 7 adapted for semi-custom integration.

FIG. 8 is a schematic diagram showing how the latch circuit in FIG. 7 could be adapted for semi-custom use. The selecting circuit 31 comprises dynamic inverters 31a and 31c, the first initializing circuit 32 comprises an AND gate 32c, and the second initializing circuit 33 comprises a NOR gate 33c. Additional inverters 38 and 39 are added to drive the outputs Qa and Qb (the locations of which are accordingly reversed). As a result, there are four logic gates between the input I and output Qb, and five gates between the input I and the output Qa.

Since an AND gate of the CMOS type comprises a NAND gate cascaded with an inverter, the actual number of gates is five between I and Qb, and six between I and Qa. These numbers could be reduced to four and five, respectively, by replacing the AND gate 32c with a NAND gate and making other necessary changes, but the penalty of the extra inverters 38 and 39 cannot be avoided.

In contrast, in FIGS. 2, 4, and 5 there are only three gates between I and Qb, and only four gates between I and Qa, (counting an AND gate as two gates). In FIG. 6, there are only two gates between I and Qa, and only three gates between I and Qb. The invention thus leads to a significant reduction in propagation delay.

Those skilled in the art will understand that the circuits shown in FIGS. 1 to 5 can be altered in various ways without departing from the spirit and scope of the invention. There are numerous ways in which the internal configurations of the selecting circuit 31, first initializing circuit 32, second initializing circuit 33, third initializing circuit 35, and feedback circuit 34 might be modified without changing the operation of the circuit. For example, if the feedback circuit 34 in FIG. 6 comprises an inverter, the selecting circuit 31 in FIG. 6 can be replaced by the selecting circuit 31 in FIG. 5. Alternatively, if the feedback circuit 34 in FIGS. 2, 4, and 5 comprises an inverter, the selecting circuit 31 in FIGS. 2, 4, and 5 can be replaced by the selecting circuit 31 in FIG. 6.

Replacement of the dynamic inverter 31a with a transmission gate is another possible modification, but this modification is inadvisable, even though it would reduce the number of transistors. The reason is that the load on the input signal I would then depend on the state of the latch signals LAa and LAb, and this would affect the timing of the circuit generating the input signal I.

While suitable for semi-custom integration, the invented latch circuit is not restricted to this type of application. It is useful whenever there is need to avoid interaction between the inverting and non-inverting outputs of a latch circuit with a high-priority control signal.

What is claimed is:

1. A latch circuit receiving an input signal, a latch signal, and a control signal having active and inactive states, and generating a pair of complementary output signals, comprising:
    a selecting circuit for selecting either the input signal or a feedback signal, responsive to said latch signal, and generating an internal signal;
    two initializing circuits, each of which receives said control signal and each generates an identical output signal that has a fixed state when said control signal is active and that is identical to said internal signal when said control signal is inactive;
    an inverter coupled to invert one of the identical output signals; and
    a feedback circuit coupled to return said one of said identical output signals to said selecting circuit as said feedback signal, before said one of said identical output signals is inverted by said inverter.

2. The circuit of claim 1, comprising an additional initializing circuit coupled in series between said selecting circuit and said two identical initializing circuits, for receiving an additional control signal having active and inactive states and forcing said internal signal to another fixed state when said additional control signal is active.

3. The circuit of claim 1, wherein said selecting circuit comprises a dynamic inverter for inverting said input signal.

4. The circuit of claim 1, wherein said feedback circuit comprises a wired interconnection.

5. A latch circuit controlled by a latch signal and a control signal having active and inactive states, comprising:
    an input terminal for receiving an input signal;
    a selecting circuit coupled to said input terminal, for selecting either said input signal or a feedback signal, responsive to said latch signal, and generating an internal signal;
    a first initializing circuit coupled to said selecting circuit, for receiving said control signal and generating an internal output signal that has a fixed state when said control signal is active, and is responsive to said internal signal when said control signal is inactive;
    an inverter coupled to said first initializing circuit, for inverting said internal output signal to generate a first output signal;
    a first output terminal coupled to said inverter, for output of said first output signal;
    a feedback circuit coupled to said first initializing circuit, for receiving said internal output signal and generating said feedback signal;
    a second initializing circuit coupled to said selecting circuit, for receiving said internal signal and said control signal and generating a second output signal identical to said internal output signal; and
    a second output terminal coupled to said second initializing circuit, for output of said second output signal.

6. The circuit of claim 5, wherein all circuits are CMOS circuits.

7. The circuit of claim 5, wherein said selecting circuit receives and is controlled by a complementary pair of latch signals.

8. The circuit of claim 5, wherein said selecting circuit comprises a dynamic inverter for inverting said input signal when said latch signal is active, and a transmission gate for transmitting said feedback signal when said latch signal in inactive.

9. The circuit of claim 5, wherein said selecting circuit comprises a dynamic inverter for inverting said input signal when said latch signal is active, and another dynamic inverter for inverting said feedback signal when said latch signal is inactive.

10. The circuit of claim 5, wherein said first initializing circuit and said second initializing circuit comprise NAND gates.

11. The circuit of claim 5, wherein said first initializing circuit and said second initializing circuit comprise AND gates.

12. The circuit of claim 5, wherein said feedback circuit comprises a wired interconnection.

13. A latch circuit controlled by a latch signal, a first control signal, and a second control signal having active and inactive states, comprising:

an input terminal for receiving an input signal;

a selecting circuit coupled to said input terminal, for selecting either said input signal or a feedback signal, responsive to said latch signal, and generating a first internal signal;

a first initializing circuit coupled to said selecting circuit, for receiving said first internal signal and said first control signal and generating a second internal signal that has a first fixed state when said first control signal is active, and is responsive to said first internal signal when said first control signal is inactive;

a second initializing circuit coupled to said first initializing circuit, for receiving said second internal signal and said second control signal and generating an internal output signal that has a second fixed state when said second control signal is active, and is responsive to said second internal signal when said second control signal is inactive;

an inverter coupled to said second initializing circuit, for inverting said internal output signal to generate a first output signal;

a first output terminal coupled to said inverter, for output of said first output signal;

a feedback circuit coupled to said second initializing circuit, for receiving said internal output signal and generating said feedback signal;

a third initializing circuit coupled to said first initializing circuit, for receiving said second internal signal and said second control signal and generating a second output signal identical to said internal output signal; and a second output terminal coupled to said third initializing circuit, for output of said second output signal.

14. The circuit of claim 13, wherein all circuits are CMOS circuits.

15. The circuit of claim 13, wherein said selecting circuit receives and is controlled by a complementary pair of latch signals.

16. The circuit of claim 13, wherein said selecting circuit comprises a dynamic inverter for inverting said input signal when said latch signal is active, and a transmission gate for transmitting said feedback signal when said latch signal is inactive.

17. The circuit of claim 13, wherein said selecting circuit comprises a dynamic inverter for inverting said input signal when said latch signal is active, and another dynamic inverter for inverting said feedback signal when said latch signal is inactive.

18. The circuit of claim 13, wherein said first initializing circuit, said second initializing circuit, and said third initializing circuit comprise NAND gates.

19. The circuit of claim 13, wherein said first initializing circuit, said second initializing circuit, and said third initializing circuit comprise NOR gates.

20. The circuit of claim 13, wherein said feedback circuit comprises a wired interconnection.

* * * * *